United States Patent [19]

Osborne

[11] 4,351,698
[45] Sep. 28, 1982

[54] VARIABLE SLOPED ETCHING OF THIN FILM HEADS

[75] Inventor: John R. Osborne, Saratoga, Calif.

[73] Assignee: Memorex Corporation, Santa Clara, Calif.

[21] Appl. No.: 311,968

[22] Filed: Oct. 16, 1981

[51] Int. Cl.³ .............................................. C23F 1/02
[52] U.S. Cl. ................................ 156/661.1; 156/656; 156/659.1; 252/79.3; 360/122
[58] Field of Search ............... 156/640, 656, 659.1, 156/661.1, 664, 650-652; 252/79.3; 430/312, 313, 314, 316, 318; 360/110, 119-121, 122, 123, 126

[56] References Cited

U.S. PATENT DOCUMENTS

| | | | |
|---|---|---|---|
| 3,210,226 | 10/1965 | Young | 156/659.1 X |
| 3,666,634 | 5/1972 | Szetela | 204/15 |
| 3,808,070 | 4/1974 | Jordan | 252/79.2 X |
| 3,833,434 | 9/1974 | Kikuchi et al. | 252/79.2 X |
| 3,839,111 | 10/1974 | Ham et al. | 252/79.4 X |
| 3,968,565 | 7/1976 | Johannes et al. | 29/603 |
| 4,022,930 | 5/1977 | Fraser | 427/86 |
| 4,082,604 | 4/1978 | Yanez | 156/656 |
| 4,092,210 | 5/1978 | Hoepfner | 156/643 |
| 4,224,400 | 9/1980 | Koel et al. | 156/656 X |
| 4,239,587 | 12/1980 | Koel et al. | 156/656 X |

*Primary Examiner*—William A. Powell
*Attorney, Agent, or Firm*—Limbach, Limbach & Sutton

[57] ABSTRACT

A method of fabricating variable sloped, as well as straight, edges on a permalloy body of a thin film head is disclosed. The process comprises forming a titanium layer on the permalloy body covering at least those areas of the body which are intended to exhibit the variable slope. A photoresist layer is formed atop the titanium layer and the permalloy body and is removed in those areas of the titanium layer and permalloy body which are not to be retained as part of the thin film head after etching. The body is then etched with an etchant containing HF and FeCl₃ to form variable sloped edges in those areas of the permalloy body covered with titanium and photoresist and straight edges in those areas of the permalloy body covered only with photoresist.

5 Claims, 7 Drawing Figures

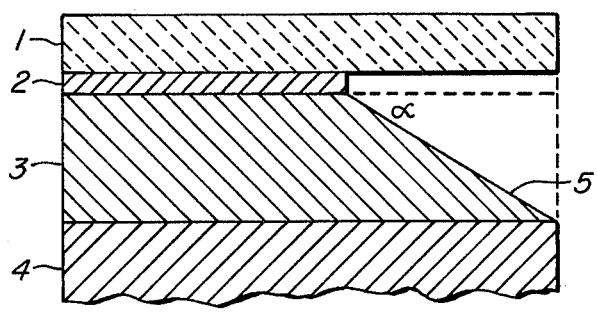
FIG._1. PRIOR ART
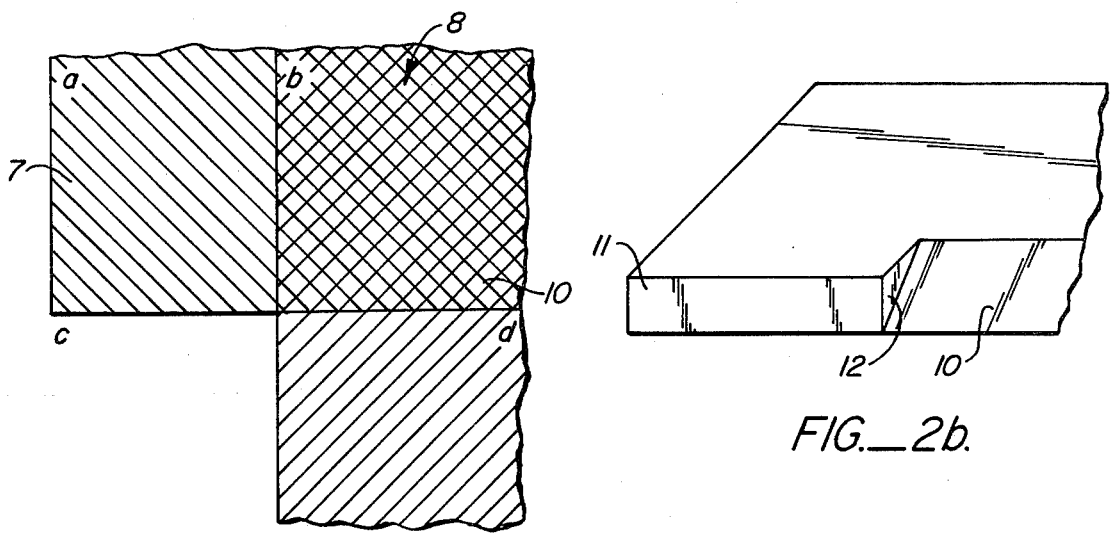
FIG._2a.
FIG._2b.
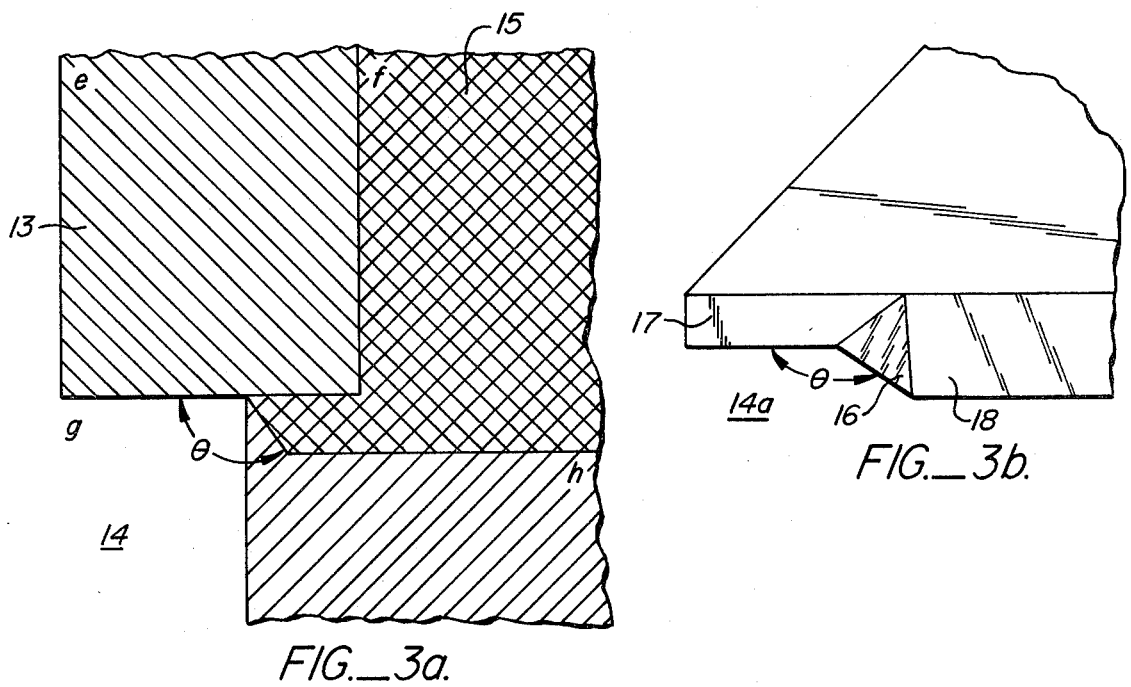
FIG._3a.
FIG._3b.

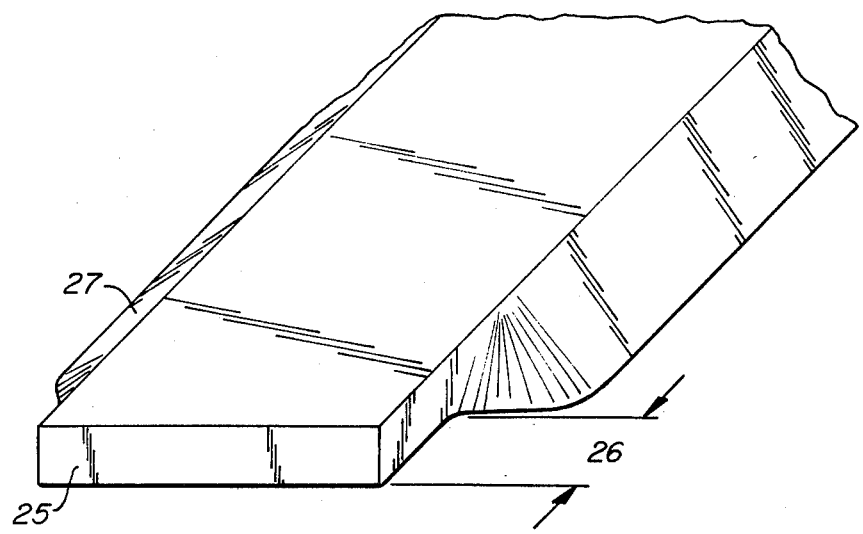
FIG._4.
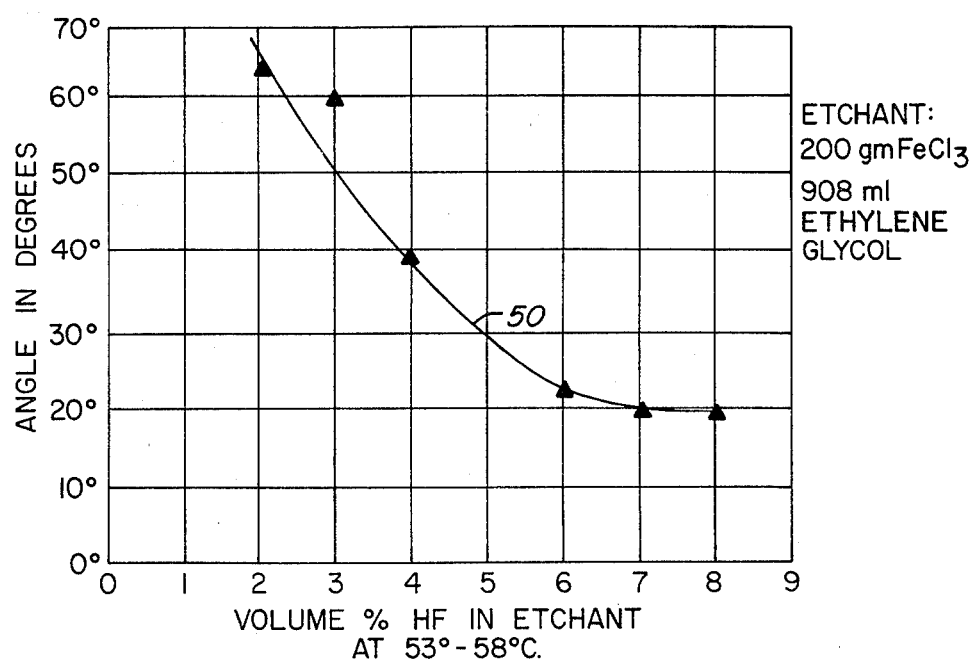
FIG._5.

VARIABLE SLOPED ETCHING OF THIN FILM HEADS

BACKGROUND OF THE INVENTION

This invention relates generally to thin film inductive transducers, commonly referred to as thin film magnetic heads. These devices are useful for recording and reading magnetic transitions on a moving magnetic recording medium.

A thin film magnetic head generally has a basic construction in which a magnetic material layer is deposited on a substrate of magnetic material, with a conductor layer interposed therebetween. This substrate and magnetic material layer constitute a magnetic circuit, the rear end of the layer being magnetically connected to the substrate and the front end being magnetically separated from the substrate to form a recording gap. Electric current is caused to flow through the conductor for recording.

The magnetic reading and/or writing head must consist of the following essential parts, namely, a magnetic circuit having a magnetic discontinuity or "gap" with the terminations of the magnetic circuit on either side of the gap called the magnetic "pole pieces", and one or a number of electrical windings which surround the circuit and are intended to permit writing and/or reading. In order to take advantage of increased data packing densities on magnetic layers, it is essential that the gap and pole pieces be made to fine tolerances. In furtherance of this goal, it is most preferable that the pole pieces traveling in close proximity to the magnetic recording surface have straight, perpendicular side walls.

In those portions of the magnetic head assembly remote from the gap region, it is not advantageous to provide a structure having straight, perpendicular side walls. For example, the electrical windings, referred to above, surround the body of the head and their physical integrity would be greatly impaired by having to circumscribe straight, perpendicular walls.

In an article by Kelly and Koel entitled "Electrochemical Aspects of the Beveling of Sputtered Permalloy Films", J. Electrochem. Soc.:Eelectrochem. Science & Tech., Vol. 125, No. 6, pp. 860–65 (June, 1978), the production of thin film magnetic heads with beveled steps in sputtered permalloy films was taught. It was disclosed that a duplex layer comprising permalloy covered with titanium could be etched with an $H_2SO_4/H_2O_2/HF$ etchant to produce a beveled surface whose bevel angle could be varied between 6° and 40°, depending upon the concentration of the HF in the etchant.

Although the ability to bevel or slope the edges of a permalloy layer in producing a thin film head is useful as taught in the article cited above, it is recognized that a much more commercially important process would be one which could produce both variable sloped edges, as well as straight edges, in producing a thin film head. For example, it is important that the pole tip region of the thin film head be of critically reproducible proportions having straight edges for it is the pole tip region which flies proximate the magnetic recording media and failure on the part of the pole tips to exhibit finely controlled straight edges can result in read/write errors.

It is thus an object of the present invention to provide a method for producing variable sloped as well as straight edges on a permalloy thin film magnetic head.

It is yet another object of the present invention to provide a method for fabricating variable, as well as straight, edges on the permalloy body of a thin film head in a single series of chemical processing steps.

These and other objects of the present invention will be more fully appreciated when considering the following disclosure and appended drawings wherein:

FIG. 1 is a side view of the formation of a variable sloped side wall as taught by the prior art.

FIGS. 2A and 2B show the application of photoresist and titanium in plan view, as well as an oblique view of the effect that such a pattern has on the permalloy surface after etching.

FIGS. 3A and 3B show a plan view of photoresist and titanium coating patterns on a permalloy surface, as well as an oblique view of how those patterns effect the etching of the permalloy layer in forming a variable sloped side wall, as well as a straight edge pole tip.

FIG. 4 is a representation of a thin film head showing the pole tip and throat region configured according to the method of the present invention.

FIG. 5 is a graph showing the degree of beveling of a permalloy film as a function of HF concentration in an etchant composed of $FeCl_3$ dissolved in ethylene glycol.

SUMMARY OF THE INVENTION

The present invention comprises a method of fabricating variable sloped as well as straight edges on the permalloy (Ni-Fe) body of a thin film head. The method comprises first forming of titanium layer on the permalloy body covering at least those areas of the body which are to exhibit the variable slope. Next, a photoresist layer is formed atop the titanium layer and the permalloy body. The photoresist is removed in those areas in which the titanium layer and permalloy body are not to be retained as part of the thin film head after etching. The thin film head is then etched with an etchant containing hydrofluoric acid (HF) and ferric chloride ($FeCl_3$) to form variable sloped edges in those areas of the permalloy body covered with titanium and photoresist, and straight edges in those areas of the permalloy body only covered by the photoresist.

DETAILED DESCRIPTION OF THE INVENTION

Turning to FIG. 1, the article entitled "Electrochemical Aspects of the Beveling of Sputtered Permalloy Films" teaches a theoretical undercutting profile, which is the basis for the formation of a variable sloped edge. More specifically, base 4 is taught to support permalloy layer 3 which has been coated with titanium layer 2 and photoresist layer 1. The use of an etchant containing HF causes undercutting below photoresist 1 simply becuase of titanium layer 2 etches faster than the permalloy. Slope 5 is governed by the concentration of the hydrofluoric acid etchant, where $$\sin \alpha = \text{etch rate of permalloy/etch rate of titanium}$$

According to this teaching, a thin film head would be produced having a uniformly consistant variable sloped wall about the entire head element. As stated previously, however, such a configuration would not be ideal in the fabrication of a thin film head for the pole piece should have straight edges.

Turning to FIG. 2a, a plan view of a permalloy layer 10 is shown split into four quadrants, while FIG. 2b shows the oblique view of the same layer after etching has taken place. Photoresist 7 is shown as completely covering quadrants a and b, while titanium layer 8 is shown completely covering quadrants b and d.

The configuration shown in FIG. 2a can be formed by applying to a substrate a layer of permalloy (Ni-Fe) alloy and overcoating said permalloy by sputtering or by any other well known technique a layer of titanium. The titanium should conveniently be of a thickness between approximately 0.08–0.1 μm, and it can uniformly be placed upon permalloy layer 10 and subsequently removed by applying a photoresist over the titanium and hardening and removing the photoresist in image-wise configuration to thus selectively expose the titanium which is subsequently removed in unprotected areas by any notoriously well known technique. As shown in FIG. 2a, the titanium is selectively removed in quadrants a and c.

Once the titanium pattern has been produced as above, the entire permalloy-titanium surface can be again covered selectively with a photoresist 7, and in FIG. 2a the photoresist is shown as remaining only in quadrants a and b. The resultant configuration is etched with an etchant composed of HF and $FeCl_3$ in ethylene glycol. The $FeCl_3$ is provided to etch the permalloy, whereas the HF etches only the Ti. In those areas covered by Ti, the HF and $FeCl_3$ are both utilized to form a variably sloped wall at the photoresist boundary. In those areas not covered by Ti, only the $FeCl_3$ is utilized to etch the permalloy forming a straight side wall at the photoresist boundary.

The result of the etching process is shown in FIG. 2b. Sloped surface 10 is shown as that area within quadrant b of FIG. 2a having a barrier surface 12 which travels along the line of demarcation between quadrants a and b. Straight side wall surface 11 is the result of $FeCl_3$ in the etchant upon unprotected permalloy in quadrant c.

Turning to FIG. 4, a finished permalloy body is shown having straight side wall 25 which can be fabricated into the pole tips of a thin film magnetic head having a throat area 26 and sloped side walls 27. Thus, the windings for the thin film head can be restricted to the area proximate sloped walls 27, thus facilitating their application and retention not only during processing but during use of the thin film head.

The configuration shown in FIG. 4 can be prepared by applying the principles shown in FIGS. 2a and 2b while reference is made to FIGS. 3a and 3b. More specifically, FIG. 3a is a plan view of a permalloy body being selectively overcoated with photoresist and titanium. Quadrant e is shown overcoated only with photoresist 13, while quadrant h is overcoated only with titanium 15. Quadrant f is coated with both titanium and photoresist, while quadrant g shows the bare permalloy area 14, which has not been overcoated at all.

FIG. 3a differs from FIG. 2a in the depiction of an angular relationship at the intersection between the titanium/photoresist covered area and the area covered by photoresist alone. By comparing FIG. 3a with FIG. 3b, it can be seen that straight side wall 17 is formed as expected, as well as sloped side wall 18. However, instead of having a perpendicular relationship between walls 17 and 18 as shown by element 12 in FIG. 2b, the two surfaces are not connected by surface 16 which provides an angular relationship between these two surfaces corresponding to angle θ in FIG. 3a noting that bare area 14 of FIG. 3a now corresponds to cut away area 14(a) of FIG. 3b. By such a technique, the configuration shown in FIG. 4 can be provided for.

EXAMPLE

Upon a suitable support of sputtered $Al_2O_3$, a permalloy film was prepared by sputtering, forming the permalloy to a thickness of 2.5 μm. Once the permalloy layer was fabricated, a uniform layer of titanium was applied thereto by sputtering to a total thickness of 0.1 μm. Next a photoresist was applied to the surface thereof, which was hardened in image-wise configuration and selectively removed in unhardened areas. The titanium was then selectively removed in area not protected by the photoresist by 10% vol. HF and the photoresist was then completely removed resulting in a permalloy body partially covered with a titanium surface.

Yet another photoresist was applied to the permalloy-titanium member again hardened in image-wise configuration and selectively removed resulting in a permalloy-titanium-photoresist body in some regions and a permalloy-photoresist body in other regions.

The elements prepared above were spray etched with solutions of approximately 200 g $FeCl_3$ in approximately 908 ml of ethylene glycol and containing various concentrations of HF at a temperature of between approximately 53°–58° C. In the permalloy-photoresist region, the $FeCl_3$ resulted in the removal of the permalloy in areas unprotected by the photoresist, resulting in straight edges at the boundaries thereof. In the permalloy-titanium-photoresist regions, the $FeCl_3$ again resulted in the removal of the permalloy in areas unprotected by the photoresist, but the HF provided beveled edges at the boundaries thereof. The degree of the beveling was dependent upon the concentration of HF present in the etchant and resulted in the generation of FIG. 5. As shown, curve 50 was generated exhibiting a marked inverse relationship between the bevel angle and the HF concentration.

While the invention has been particularly shown and described with reference to a preferred embodiment thereof, it will be understood by those skilled in the art that various changes in form and detail may be made therein without departing from the spirit, scope and teaching of the invention. Accordingly, the method herein disclosed is to be considered merely as illustrative and the invention is to be limited only as specified in the claims.

What is claimed is:

1. A method of fabricating variable sloped, as well as straight, edges on the Ni-Fe body of a thin film head comprising:
    A. forming a Ti layer on the Ni-Fe body covering at least those areas of the body to exhibit the variable slope;
    B. forming a photoresist layer atop the Ti layer and Ni-Fe body;
    C. removing the photoresist in those areas of the Ti layer and Ni-Fe body which are not to be retained as part of the thin film head after etching;
    D. etching the thin film head with an etchant containing HF and $FeCl_3$ to form variable sloped edges in those areas of the Ni-Fe body covered with Ti and photoresist and straight edges at the boundary of those areas of the Ni-Fe body covered only with photoresist.

2. The method of claim 1 wherein the resist is removed after step D.

3. The method of claim 1 wherein the $FeCl_3$ etchant also contains ethylene glycol.

4. The method of claim 1 wherein the straight edges define the pole tip region of the thin film head.

5. The method of claim 1 wherein the Ti layer is formed to a thickness of approximately 0.8 to 0.1 μm.

* * * * *